(12) United States Patent
Streif et al.

(10) Patent No.: US 6,956,409 B2
(45) Date of Patent: Oct. 18, 2005

(54) REFERENCE VOLTAGE DETECTOR FOR POWER-ON SEQUENCE IN A MEMORY

(75) Inventors: Harald Streif, Burlington, VT (US); Oliver Kiehl, Charlotte, VT (US); Mike Killian, Richmond, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/651,281

(22) Filed: Aug. 28, 2003

(65) Prior Publication Data

US 2005/0046451 A1 Mar. 3, 2005

(51) Int. Cl.[7] .............................................. H03K 5/153
(52) U.S. Cl. ........................... 327/82; 327/77; 327/143
(58) Field of Search ................................. 327/143, 198, 327/215, 219, 77, 78, 82

(56) References Cited

U.S. PATENT DOCUMENTS

| | | | | |
|---|---|---|---|---|
| 4,767,947 A | * | 8/1988 | Shah ........................... 327/176 |
| 5,172,012 A | * | 12/1992 | Ueda ........................... 327/143 |
| 5,218,237 A | * | 6/1993 | Mao ............................. 327/173 |
| 5,321,317 A | * | 6/1994 | Pascucci et al. ............. 327/143 |
| 5,440,263 A | * | 8/1995 | Fournel et al. .............. 327/546 |
| 5,723,990 A | * | 3/1998 | Roohparvar .................. 327/81 |
| 5,864,247 A | * | 1/1999 | Hirano et al. ................ 327/143 |
| 5,864,251 A | * | 1/1999 | Bloker et al. ................ 327/172 |
| 6,052,006 A | * | 4/2000 | Talaga et al. ................ 327/143 |
| 6,198,318 B1 | * | 3/2001 | Bhaskaran et al. .......... 327/143 |
| 6,577,166 B2 | * | 6/2003 | Lim .............................. 327/77 |

* cited by examiner

Primary Examiner—Terry D. Cunningham
(74) Attorney, Agent, or Firm—Slater & Matsil, L.L.P.

(57) ABSTRACT

System and method for detecting a reference signal. A preferred embodiment comprises a latch (such as the latch 320) and a filter (such as the filter 325). The latch tracks a reference signal at its input and reflects the reference signal at its output. The filter can be coupled to the output of the latch and may inject a delay to help eliminate the effects of glitches and noise. When the reference signal reaches a specified value, a control signal from the filter causes the latch to store the reference signal. A delay imparted by the filter ensures that the latch does not store the reference signal until a finite amount of time after the reference signal reaches the specified value.

18 Claims, 5 Drawing Sheets

REFERENCE VOLTAGE DETECTOR FOR POWER-ON SEQUENCE IN A MEMORY

TECHNICAL FIELD

The present invention relates generally to a circuit for electronic circuit operation, and more particularly to a circuit for detecting a reference signal needed during a power-on sequence.

BACKGROUND

In a memory, differential signaling is typically used to transmit signals. Differential amplifiers can be used to compare differential inputs against a reference voltage signal to determine the value of a piece of data stored in a memory element, for example. It is therefore, important to have the reference voltage signal at the proper value prior to use. If the reference voltage signal is not at the proper value, then the comparisons made with the differential inputs can result in erroneous assignment of data stored in memory elements.

According to the Joint Electronic Devices Engineering Council (JEDEC) technical standard for double data-rate synchronous dynamic random access memory (DDR SDRAM), inputs to the DDR SDRAM ("memory"), with the exception of a clock enable (CKE) and the main clock signals (CLK,/CLK), are not recognized as being valid until after a reference voltage signal (VREF) is applied. This helps to ensure that VREF has attained the proper value prior to the commencement of operations in the memory. The clock enable, CKE, can initially have a low level (typically between 0.0 v to 0.6 v) and when it transitions to a high level prior the memory beginning operation. Maintaining CKE at the low level ensures that the memory does not begin normal operation until VREF has reached its proper value. However, it is possible to bring CKE to a high level prior to VREF reaching its proper value.

However, it may still be possible begin operation prior to VREF attaining the proper value. For example, a glitch on the VREF signal line may temporarily bring VREF to the proper value and enable the operation of the memory. Since VREF has reached the proper value (albeit for only a short period of time), CKE can transition to a high level. However, by the time the memory begins operations, the glitch has disappeared and VREF is no longer at the proper value.

One prior art method used to address this problem involves the generation of a "CHIP ready" signal once a required power-up command sequence is received. This helps to ensure that even if both VREF and CKE are at their specified values to allow the memory to begin operations, the memory does not start operations until a sequence of commands of specified order is received. While a second prior art method uses a low-voltage CKE receiver, a separate CKE receiver designed to receive a 'low' level. The separate CKE receiver can help to eliminate the problem associated with glitches and noise producing erroneous value detections.

One disadvantage of the first prior art method is that the "CHIP ready" signal may be generated accidentally after receiving a random command sequence which may happen to fit the power-up sequence.

A second disadvantage of the first prior art method is that the "CHIP ready" signal can interfere with circuitry in the memory and may result in unwanted and unexpected states.

A disadvantage of the second prior art method is that the DDR SDRAM specifications require a fast detection and does not allow for most kinds of filtering operations that would prevent glitches and/or noise on CKE.

SUMMARY OF THE INVENTION

These and other problems are generally solved or circumvented, and technical advantages are generally achieved, by preferred embodiments of the present invention which provides a circuit for ensuring the proper detection of a reference voltage signal during a power-on sequence for a memory.

In accordance with a preferred embodiment of the present invention, a circuit comprising a latch having an input coupled to a reference voltage signal input, the latch containing circuitry to detect when the input rises to a specified level and asserting a clock enable signal when the input rises to the specified level, and a filter having an input coupled to an output of the latch and an output coupled to the latch, the filter containing circuitry to eliminate transients from a signal at its input.

In accordance with another preferred embodiment of the present invention, a circuit comprising a latch having an input coupled to a reference voltage signal input, the latch for use in tracking the reference voltage signal input, and a filter having an input coupled to the output of the latch, the filter for use in eliminating transients from a signal at its input.

An advantage of a preferred embodiment of the present invention is that the reference voltage signal is ensured of being at the desired level prior to the memory beginning operation. This can prevent the misdetection of data stored in memory elements.

A further advantage of a preferred embodiment of the present invention is that glitches and noise can be filtered while adherence to strict performance requirements is still met. This ensures interoperability with electronic equipment expecting a certain level of performance.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a memory adherent to the JEDEC DDR SDRAM technical standard. The JEDEC DDR SDRAM technical standard is published in a document entitled "JEDEC Standard—Double Data Rate (DDR) SDRAM Specification—JESD79C (Revision of JESD79B)," published March 2003, which is herein included by reference. The invention may also be applied, however, to other memories and integrated circuits wherein the accurate detection of a reference voltage signal during a power-on sequence is important to proper operation.

Figure 1:
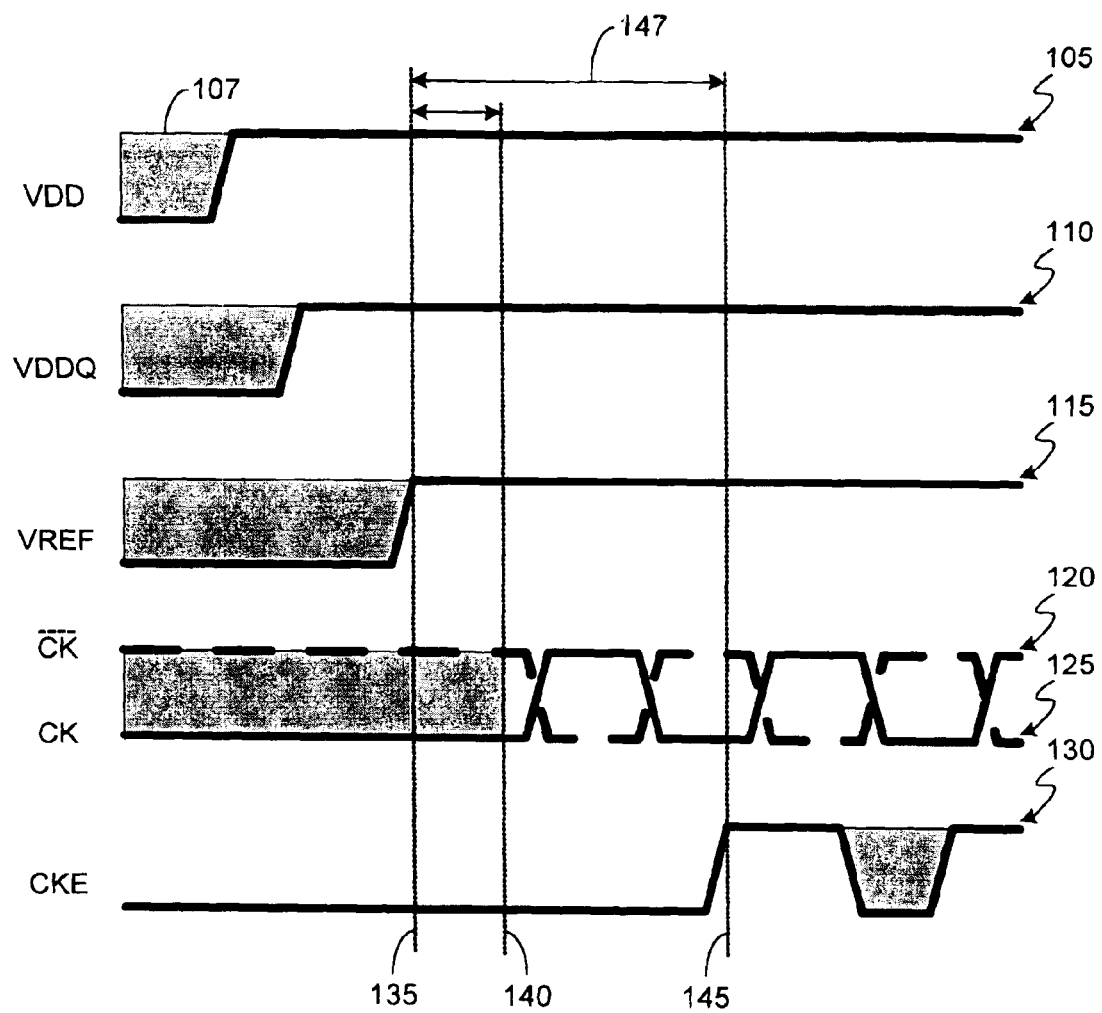
FIG. 1 is a timing diagram of a power-on sequence for a JESD79C compliant memory.

With reference now to FIG. 1, there is shown a timing diagram illustrating a power-on sequence for a JEDEC JESD79C technical standard compliant DDR SDRAM memory module ("memory"). The JESD79C technical standard specifies a specific sequence of events that a memory should undergo during initial power-on sequence. A first step in the power-on sequence involves the turning on of voltage supplies, for example, VDD and VDDQ. A first curve 105 displays the behavior of voltage supply VDD. Prior to being turned on, the voltage supply VDD can be in an unknown state. This can be represented as a shaded area, for example, shaded area 107. A second curve 110 displays the behavior of voltage supply VDDQ.

After the voltage supplies are turned on, the memory may remain inoperative to permit time for the voltage supplies to become stable and for a reference voltage signal, VREF, to reach a desired value. A third curve 115 displays the behavior of the reference voltage signal VREF. After the reference voltage signal VREF reaches the desired value, the memory can enter a second step in the power-on sequence.

After the reference voltage signal VREF becomes defined (displayed in FIG. 1 as a dashed vertical line 135), other signals in the memory can be turned on, such as a clock. A fourth and fifth curves 120 and 125 illustrate the clock and its inverse for the memory. After the clock and its inverse are turned on, a period of time elapses and the clock (and its inverse) becomes stabilized (displayed as a second dashed vertical line 140). Finally, after a period of time after the reference voltage signal VREF reaches the desired value and after the voltage supplies have become stable and the clock stabilizes, a clock enable, CKE, becomes active and operations in the memory may commence. A sixth curve 130 displays the behavior of the clock enable CKE. In FIG. 1, the time when the clock enable CKE becomes active is displayed as a third dashed vertical line 145, with the time between the reference voltage signal VREF become defined and the clock enable CKE becoming active being highlight as an elapsed time span 147.

According to the JESD79C technical specifications, the clock enable CKE is forced low until the reference voltage signal VREF becomes defined. Unfortunately, it is possible to erroneously detect a clock enable CKE as high when the reference voltage signal VREF is still undefined. This may happen for the reference voltage signal VREF being low or as a result of noise or a glitch on the VREF level. In a situation where the reference voltage signal VREF and the clock enable CKE are both low (or on the same level), a differential receiver may produce a random output. As another example, a glitch may be present on the reference voltage signal VREF line and cause the erroneous detection of the reference voltage signal VREF becoming defined. The presence of the glitch or noise may temporarily raise the signal level of the reference voltage signal VREF to a level that has been specified as being defined. With the reference voltage signal VREF being erroneously detected as becoming defined, the clock enable CKE is no longer being forced to remain low and the memory is permitted to complete its power-on sequence and begin operation.

Figure 2:
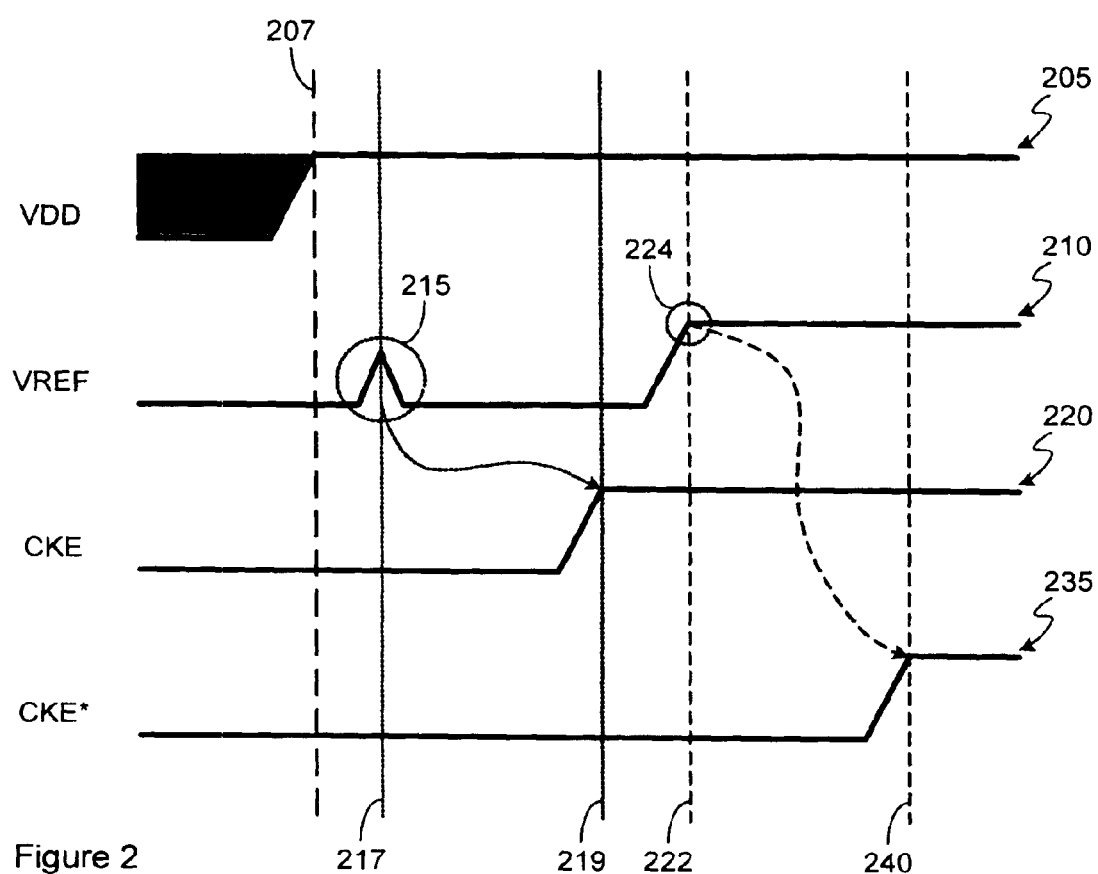
FIG. 2 is a timing diagram illustrating a possible effect of a glitch on a reference voltage signal.

With reference now to FIG. 2, there is shown a timing diagram illustrating some of the possible effects of the presence of a glitch (or some noise) on a reference voltage signal VREF line during a power-on sequence for a memory. A first curve 205 displays the behavior of a voltage supply, VDD, which can be turned on and then subsequently becoming stable at a time represented in FIG. 2 as a long dashed vertical line 207. Prior to the time that the voltage supply VDD becomes stable, the output of the voltage supply VDD may be in an unknown state (displayed as a shaded area). Note that the voltage supply VDD may be one out of a plurality of voltage supplies used in the memory and when reference is made to the voltage supply VDD in the discussion of FIG. 2, reference is also made to the other voltage supplies in the memory. With the voltage supply VDD becoming stabilized, a reference voltage signal VREF (displayed in FIG. 2 as a second curve 210) can begin to rise.

According to the technical specifications, once the reference voltage signal VREF reaches a specified level, the memory may enter another stage of the power-on process. This requirement is to ensure that the memory does not begin operation until the reference voltage signal VREF has reached a level where accurate determination of the contents of memory storage locations can be performed. If the reference voltage signal VREF is at a level that is different from the specified level, then the contents of memory storage locations may be erroneously detected.

Unfortunately, the presence of glitches and/or noise on the reference voltage signal VREF line may lead to an incorrect conclusion that the reference voltage signal has reached the specified level when it has not. For example, a glitch 215 (occurring at a time indicated by a first dotted vertical line 217) may be of sufficient magnitude and duration to lead detection hardware into thinking that the reference voltage signal VREF has reached the specified level. At a time (indicated by a second dotted vertical line 219) after the occurrence of the glitch 215, a clock enable signal CKE (displayed in FIG. 2 as a third curve 220) becomes active and the memory can commence operation. Unfortunately, the glitch 215 has gone away by the time the clock enable signal CKE becomes active and any comparisons made with the reference voltage signal VREF will be made with the reference voltage signal at an incorrect level. The reference voltage signal VREF correctly reaches a specified level at a time displayed as a second dashed vertical line 222 and after a certain period of time, the clock enable signal CKE becomes active (displayed in FIG. 2 as a fourth curve 235 (CKE*) to differentiate it from the incorrect clock enable signal CKE displayed as the third curve 220).

Since the presence of glitches and/or noise on the reference voltage signal VREF can possibly result in the memory beginning operation prior to when the reference voltage signal VREF reaches the specified level and therefore lead to the improper operation of the memory, it can be vital to ensure that when the reference voltage signal VREF has actually reached the specified level when it is detected as having reached the specified level.

Figure 3:
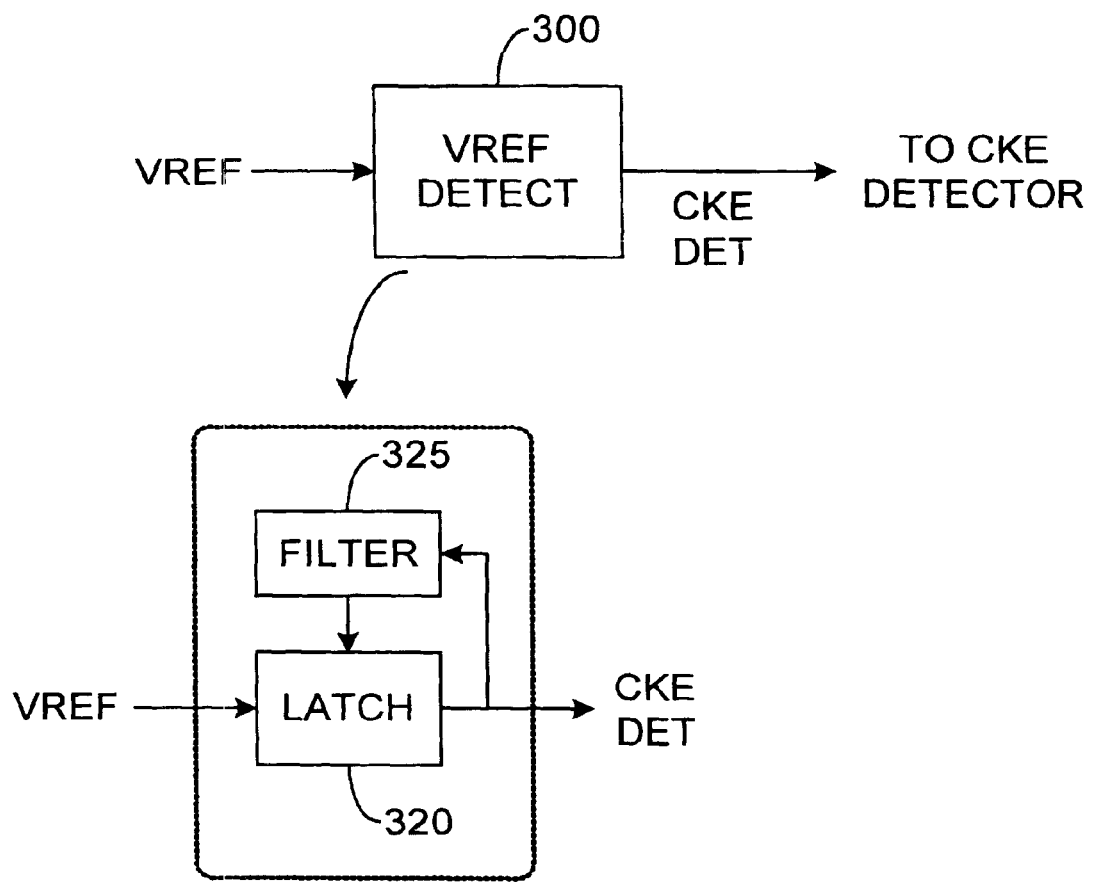
FIG. 3 is a diagram of a reference voltage detection unit, according to a preferred embodiment of the present invention.

With reference now to FIG. 3, there is shown a diagram illustrating a high-level view of a reference voltage detection unit (RVDU) 300 for use in a memory, according to a preferred embodiment of the present invention. According to a preferred embodiment of the present invention, the RVDU 300 may have as an input, the reference voltage signal VREF and as an output, a clock enable signal CKE detect signal, which can be provided to a clock enable signal CKE detector. The clock enable signal CKE detector can be a receiver used to detect when the clock enable signal CKE becomes active, so that the memory can commence operations.

The RVDU 300 can use filtering to help eliminate the effects of glitches and/or noise that may be present on the reference voltage signal VREF line. The filtering exploits the typically transient nature of glitches and/or noise. According to a preferred embodiment of the present invention, the filtering can be performed by a delay block. The delay imparted by the delay block should be longer than the expected duration of glitches and/or noise on the reference voltage signal VREF line, but should not be so long that it could negatively impact the duration of the memory's power-on sequence. Preferably, the delay should be on the order of three (3) nano-seconds or slightly larger.

According to a preferred embodiment of the present invention, the RVDU 300 may be built from a latch 320 and a filter 325. It can be preferred that during the initial power-on sequence, the latch 320 be initialized to a low voltage potential state. The output of the latch 320 can reflect changes in the input (the reference voltage level VREF). The filter 325, having an input coupled to the output of the latch 320 and an output that may be used to set the latch 320. When the output of the filter 325 rises to a high voltage potential, the latch 320 can be set to hold the value at its input until the RVDU 300 is reset. Therefore, the rise in the reference voltage signal VREF level can be used to set the latch 320 after a delay imparted by the filter 325 to help ensure that the detected level in the reference voltage signal VREF was not due to a glitch or noise.

Figure 4:
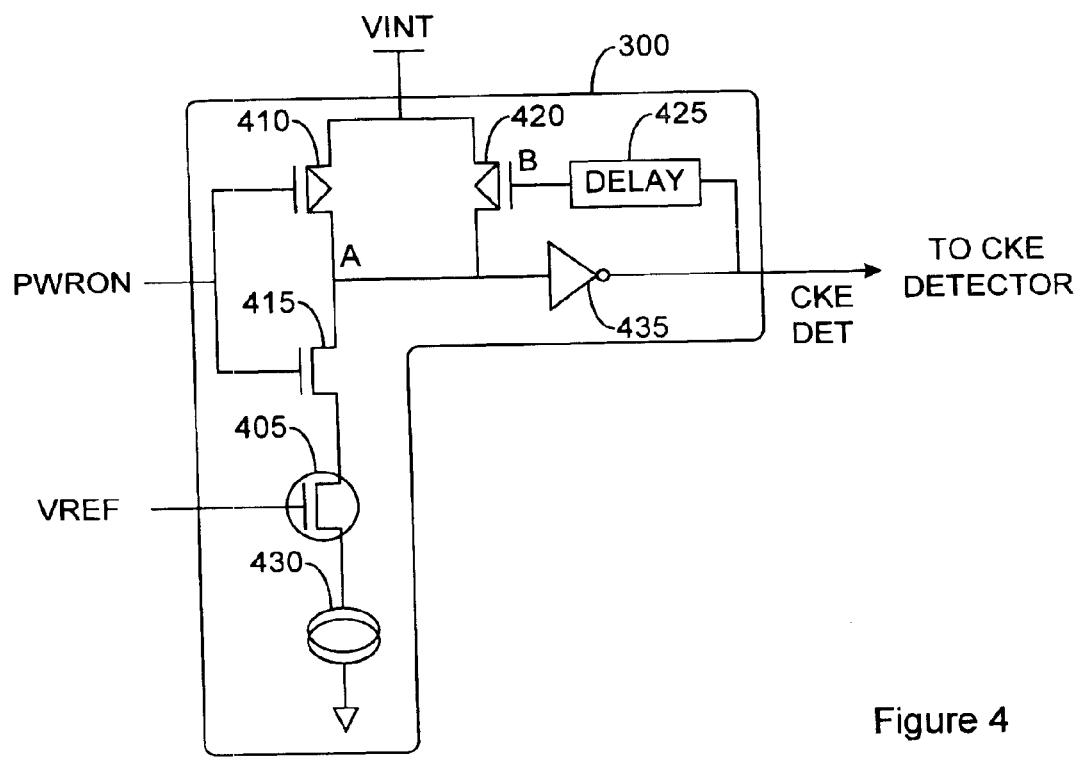
FIG. 4 is a diagram of a detailed view of a reference voltage detection unit, according to a preferred embodiment of the present invention.

With reference now to FIG. 4, there is shown a diagram illustrating a detailed view of the RVDU 300 of a memory, according to a preferred embodiment of the present invention. As discussed above, the RVDU 300 can be used to help eliminate the misdetection of the signal level of its input (the reference voltage signal VREF in this case) due to the presence of glitches and/or noise. The input (the reference voltage signal VREF) can be provided to a gate terminal of a first transistor 405, preferably an NFET (N-type field effect transistor). Since the first transistor 405 is an NFET, when there is a low voltage potential at its gate terminal, the first transistor 405 behaves like an open circuit and does not conduct.

According to a preferred embodiment of the present invention, the RVDU 300 may have a second input. The second input may be a power-on signal for the memory. The power-on signal may be in a low voltage potential when the memory is not powered-on and a high voltage potential when the memory is powered on. The second input can be provided to the gate terminals of a pair of transistors (a second transistor 410 and a third transistor 415). Preferably, the second transistor 410 is a PFET (P-type field effect transistor) while the third transistor 415 is an NFET. According to a preferred embodiment of the present invention, the source terminal of the second transistor 410 may be coupled to a voltage source (labeled VINT in FIG. 4) while the drain terminal of the second transistor 410 may be coupled to the drain terminal of the third transistor 415. Furthermore, the source terminal of the third transistor 415 may be coupled to the drain terminal of the first transistor 405. The source terminal of the first transistor 405 may be coupled to substrate ground or optionally to a current limiter 430. The current limiter 430 can be used to place a limit on the amount of current that can be drawn. Note that the presence (or absence) of the current limiter 430 does not change the operation of the present invention.

A fourth transistor 420 (preferably a PFET transistor) may be arranged in parallel to the second transistor 410, with its source terminal coupled to the voltage source (labeled VINT) and its drain terminal coupled to the source terminal of the third transistor. According to a preferred embodiment of the present invention, the gate terminal of the fourth transistor 420 may be coupled to an output of a delay block 425. An inverter 435 with an input that can have an input coupled to the source terminal of the third transistor 415 and an output that may provide the clock enable signal CKE detect signal. The output of the inverter 435 may also be provided to the delay block 425. As discussed previously, the delay block 425 can be used to provide filtering for glitches and/or noise (provided that the glitches and/or noise have a duration that is less than the delay) that could cause the erroneous detection of the reference voltage signal VREF. Note that a filter may be used in place of the delay block 425.

The RVDU 300 may operate as follows: prior to an initial power-on, the second input (labeled PWRON) may be at a low voltage potential. With the gate terminal at a low voltage potential, the second transistor 410 may be closed (conducting) while the third transistor 415 may be open (non-conducting). Therefore, a voltage measurement taken at point "A" could how a high voltage potential, with the actual value dependant upon the value of VINT. Setting point "A" at a high voltage potential is an initialization of the RVDU 300. With point "A" at a high voltage potential, then the output of the inverter 435 (and the output of the RVDU 300) can be a low voltage potential. Since the clock enable signal CKE signal (the output of the RVDU 300) set initially to a low voltage potential, the memory may not commence operation.

With the output of the inverter 435 at a low voltage potential, then the output of the delay block 425 (or filter) can also be at a low voltage potential (after a period of time that can be equal to the delay of the delay block 425). Since the output of the delay block 425 (also referred to as point "B"), the fourth transistor may be closed and providing a conductive path between point "A" and VINT. Then, at an initial power-on, the second input may be brought to a high voltage potential. With the gate terminal at a high voltage potential, the second transistor 410 may be open and the third transistor 415 may be closed. The closed fourth transistor 420 can maintain the high voltage potential at point "A."

The RVDU 300 can remain in the above state until the first input to the RVDU 300 (the reference voltage signal VREF) begins to change. According to the technical specifications, the reference voltage signal VREF begins at a low voltage potential and rises until it reaches the specified level. While the reference voltage signal VREF is at a low voltage potential, the first transistor 405 remains open and a current path may not exist between VINT and substrate ground. As the reference voltage signal VREF (the first input to the RVDU 300) rises, the first transistor 405 may become more conductive, then when the reference voltage signal VREF reaches it specified value, the first transistor 405 may become fully conductive.

With a current path from VINT to substrate ground created by the closing of the first transistor 405, the voltage potential at point "A" can drop. As the voltage potential at point "A" drops, the output of the RVDU 300 rises (as does the voltage potential at point "B" after the delay incurred at the delay block 425). The delay incurred at the delay block 425 insures that should the reference voltage signal VREF have risen to the specified level due to a glitch or noise, then the RVDU 300 does not erroneously report that the reference voltage signal VREF has reached the specified level.

When the voltage potential at point "A" drops fully and the voltage potential at point "B" rises fully, the fourth transistor 420 opens, which can result in the severing of the current path between VINT and substrate ground. Then, the voltage potential at point "A" can be tied to substrate ground. According to a preferred embodiment of the present invention, the RVDU 300 may be a one-shot circuit, meaning that once the reference voltage signal VREF reaches its specified value and the output of the RVDU 300 rises to a high voltage potential, the RVDU 300 may no longer function as a glitch and/or noise filter for the reference voltage signal VREF. Once the RVDU 300 asserts the high voltage potential on its output, signifying that the reference voltage level has reached the specified level, a clock enable signal CKE detector (not shown) can be used to determine the presence of the clock enable signal CKE and permit the memory to begin operation.

Figure 5:
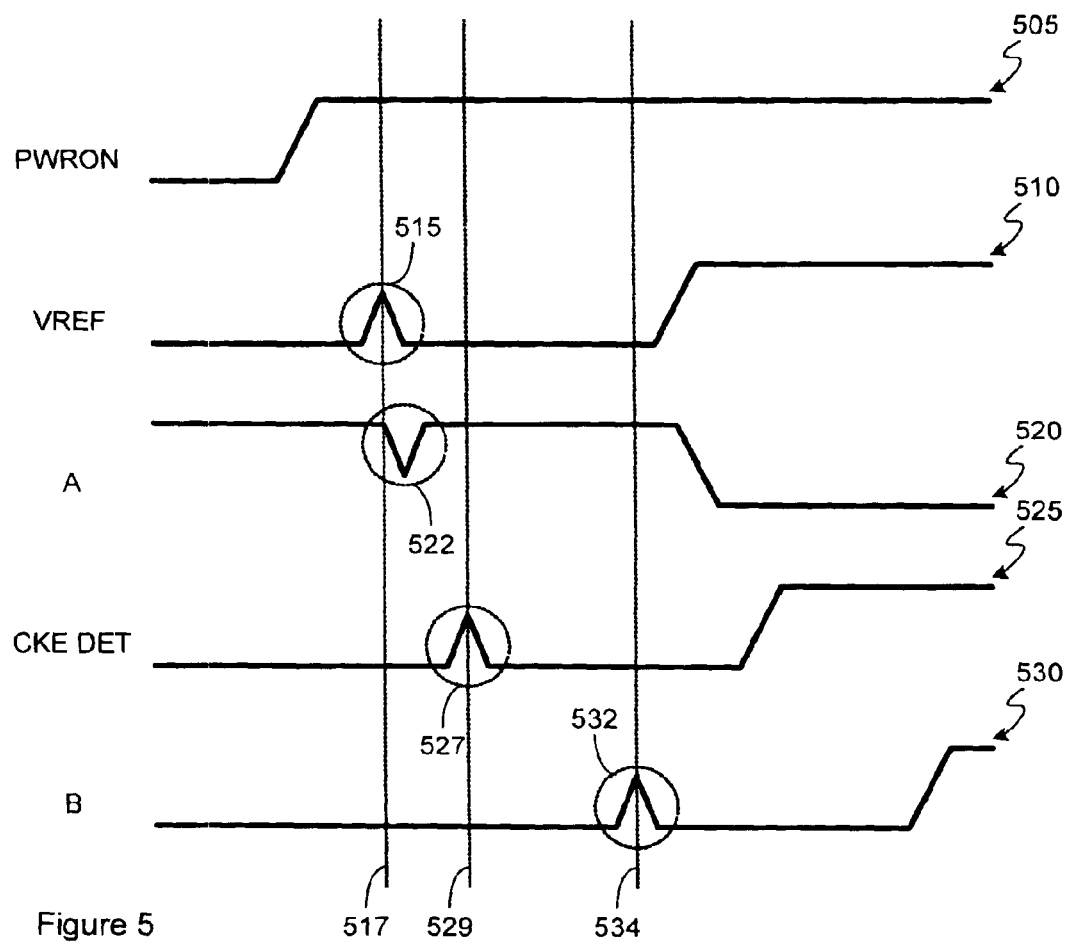
FIG. 5 is a timing diagram of the operation of a reference voltage detection unit, according to a preferred embodiment of the present invention.

With reference now to FIG. 5, there is shown a timing diagram illustrating the operation of the RVDU 300 for a memory, according to a preferred embodiment of the present invention. A first curve 505 illustrates the behavior of the second input of the RVDU 300, labeled PWRON. A second curve 510 illustrates the behavior of the first input of the RVDU 300, the reference voltage signal VREF. The second curve 510 displays that there is a glitch 515 present in the reference voltage signal VREF at a time illustrated as a first dashed vertical line 517. As displayed, the magnitude of the glitch 515 may be sufficient to result in the erroneous determination that the reference voltage signal VREF has reached its specified state.

A third curve 520 illustrates the voltage potential at point "A." The glitch 515 in the reference voltage signal VREF may result in the presence of a similar glitch in the voltage potential at point "A." Note that the voltage potential at point "A" may essentially be the inverse of the reference voltage signal VREF with a small propagation delay. A fourth curve 525 illustrates the output of the RVDU 300, which may be provided to a clock enable signal CKE detector. It is clear in the fourth curve 525 that if the glitch 515 was erroneously detected as the reference voltage level VREF reaching the specified level, by the time the glitch 515 propagates to the output of the RVDU 300 as a glitch 527 (occurring at a time illustrated as a second dashed vertical line 529), the reference voltage level could have dropped down to a level that could be below the specified level. A fifth curve 530 illustrates the voltage potential at point "B" (also the output of the delay unit 425 (FIG. 4)). Note that a glitch in the reference voltage signal VREF that may be smaller than the time delay of the delay element 425 may not be detected sing the voltage potential at point "A" may be restored by the fourth transistor 420 (FIG. 4) prior to the signal reaches point "B". Due to the nature of the RVDU 300 as a one shot circuit, such a glitch is filtered out in a way that the output doesn't switch permanently high.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit comprising:
    a latch having an input coupled to a reference voltage signal input, the latch containing circuitry to detect when the input rises to a specified level and asserting a clock enable signal when the input rises to the specified level comprising an input circuit coupled to the reference voltage signal input for changing the state of the latch in response to the reference voltage signal input, and output inverter coupled to the input circuit to drive the output terminal of the latch, and a feedback transistor for maintaining the latch in a condition responsive to a control signal; and
    a filter having an input coupled to the output inverter and outputting the control signal to the feedback transistor, the filter containing circuitry to eliminate transients from a signal at its input.

2. The circuit of claim 1, wherein the input circuit comprises:
    a first transistor having a first terminal coupled to a voltage supply and a second terminal coupled to a second input;
    a second transistor having a first terminal coupled to the first and the feedback transistors and a second terminal coupled to the second input; and
    a third transistor having a first terminal coupled to the second transistor and a second terminal coupled to the first input.

3. The circuit of claim 2, wherein the second input is a power-on signal line.

4. The circuit of claim 2, wherein the third transistor is coupled to third terminals of the first and feedback transistors.

5. The circuit of claim 2, wherein a third terminal of the fourth transistor is coupled to substrate ground.

6. The circuit of claim 2, wherein a third terminal of the fourth transistor is coupled to a current limiter.

7. The circuit of claim 2, wherein a second terminal of the second transistor is coupled to the output of the filter.

8. The circuit of claim 2, wherein the first terminal is the source terminal, the second terminal is the gate terminal, and the third terminal is the drain terminal.

9. The circuit of claim 2, wherein the first and feedback transistors are P-type field effect transistors and the second and third transistors are N-type field effect transistors.

10. The circuit of claim 1, wherein the filter is a delay element.

11. A circuit comprising:
a latch having an input coupled to a reference voltage signal input, the latch for use in tracking the reference voltage signal input comprising an input circuit for receiving the reference voltage signal input, an output inverter circuit coupled to the input circuit for driving the output of the latch, a feedback circuit for maintaining a set condition of the latch and a filter having an input coupled to the output inverter and an output coupled to the feedback circuit for eliminating transients from signal at the latch input;
whereby a current condition of the latch will not be modified by a transient change in the reference voltage input due to the operation of the filter and the feedback circuit.

12. The circuit of claim 11, wherein the latch stores the value at its input when the control signal transitions to a high voltage potential.

13. The circuit of claim 12, wherein the circuit is a one-shot circuit, wherein the latch stores the value.

14. The circuit of claim 11, wherein the filter is a delay element.

15. The circuit of claim 14, wherein the delay of the filter is greater than an expected duration of a glitch in the input to the latch.

16. The circuit of claim 11, wherein the circuit is used to detect a reference voltage signal for a memory chip during a power-sequence.

17. The circuit of claim 16, wherein the memory chip is double data rate memory chip.

18. The circuit of claim 17, wherein the memory chip is a JESD79C compliant memory chip.

* * * * *